United States Patent
Maruyama

(10) Patent No.: US 9,083,264 B2
(45) Date of Patent: Jul. 14, 2015

(54) VIBRATION ELEMENT, MANUFACTURING METHOD THEREOF, AND VIBRATION WAVE ACTUATOR

(75) Inventor: Yutaka Maruyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 450 days.

(21) Appl. No.: 13/118,320

(22) Filed: May 27, 2011

(65) Prior Publication Data

US 2011/0291525 A1    Dec. 1, 2011

(30) Foreign Application Priority Data

May 31, 2010  (JP) ................................. 2010-124711

(51) Int. Cl.
| | |
|---|---|
| H01L 41/053 | (2006.01) |
| H02N 2/00 | (2006.01) |
| H02N 2/02 | (2006.01) |
| H04R 17/00 | (2006.01) |
| H04R 31/00 | (2006.01) |

(52) U.S. Cl.
CPC ............ *H02N 2/0015* (2013.01); *H02N 2/026* (2013.01); *H04R 17/00* (2013.01); *H04R 31/00* (2013.01); *H04R 2440/00* (2013.01); *Y10T 29/42* (2015.01)
USPC ................. 310/334; 310/323.01; 310/323.02; 310/323.16; 310/328

(58) Field of Classification Search
USPC .......... 310/328, 334, 323.01, 323.02, 323.03, 310/323.04, 323.16
See application file for complete search history.

(56) References Cited

U.S. PATENT DOCUMENTS

| | | | |
|---|---|---|---|
| 7,109,639 B2* | 9/2006 | Yamamoto et al. ...... | 310/323.16 |
| 7,710,001 B2* | 5/2010 | Morris et al. ................. | 310/334 |
| 2001/0036055 A1* | 11/2001 | Nakamura ..................... | 361/502 |
| 2002/0036679 A1* | 3/2002 | Ueki et al. ......................... | 34/72 |
| 2004/0201352 A1* | 10/2004 | Okamoto et al. ............. | 313/623 |
| 2006/0043845 A1* | 3/2006 | Maruyama et al. ........... | 310/358 |
| 2007/0084033 A1* | 4/2007 | Ito et al. ....................... | 29/25.35 |
| 2007/0171260 A1* | 7/2007 | Lee et al. ......................... | 347/71 |
| 2009/0220765 A1* | 9/2009 | Okamura et al. ........... | 428/316.6 |
| 2010/0014143 A1* | 1/2010 | Kanno et al. ............... | 359/224.1 |
| 2010/0090033 A1* | 4/2010 | Sakamoto et al. ............ | 239/584 |
| 2010/0208412 A1* | 8/2010 | Takashima et al. ........... | 361/322 |
| 2010/0320284 A1* | 12/2010 | Okamura ................... | 239/102.2 |
| 2011/0025168 A1 | 2/2011 | Maruyama | |

FOREIGN PATENT DOCUMENTS

| | | |
|---|---|---|
| JP | 10-181013 A | 7/1998 |
| JP | 2007123483 A | 10/2005 |
| JP | 2006-74850 A | 3/2006 |

(Continued)

OTHER PUBLICATIONS

Notification of Reasons for Refusal of the counterpart Japanese Patent Application No. 2010-124711; Dispatch Date Mar. 18, 2014.

*Primary Examiner* — Derek Rosenau
*Assistant Examiner* — Bryan Gordon
(74) *Attorney, Agent, or Firm* — Canon U.S.A. Inc., IP Division

(57) ABSTRACT

A vibration element includes a substrate, a piezoelectric element including a piezoelectric layer and an electrode layer, and a bonding layer provided between the piezoelectric element and the substrate and comprising ceramic containing melted glass powder, wherein the vibration element causes the substrate to vibrate by vibration energy of the piezoelectric element to output the vibration energy of the substrate, and the piezoelectric element is fixed to the substrate via the bonding layer.

12 Claims, 10 Drawing Sheets

(56) References Cited

FOREIGN PATENT DOCUMENTS

| JP | 2007-123483 A | 5/2007 |
| JP | 2009124791 A | 11/2007 |
| JP | 2008-211047 A | 9/2008 |
| JP | 2009-124791 A | 6/2009 |
| JP | 2011-045869 A | 3/2011 |
| JP | 2011-217493 A | 10/2011 |

* cited by examiner

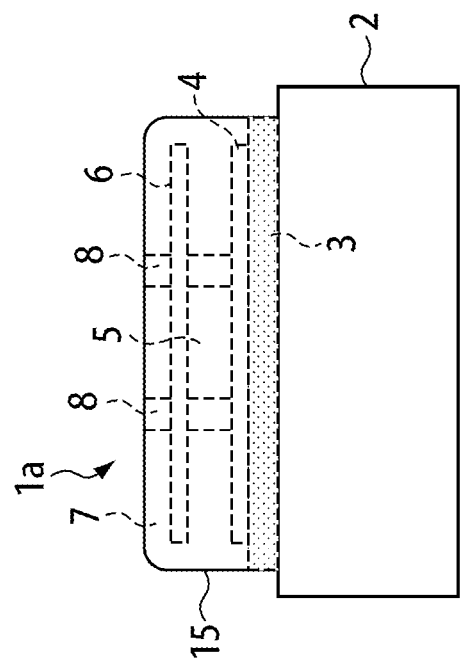
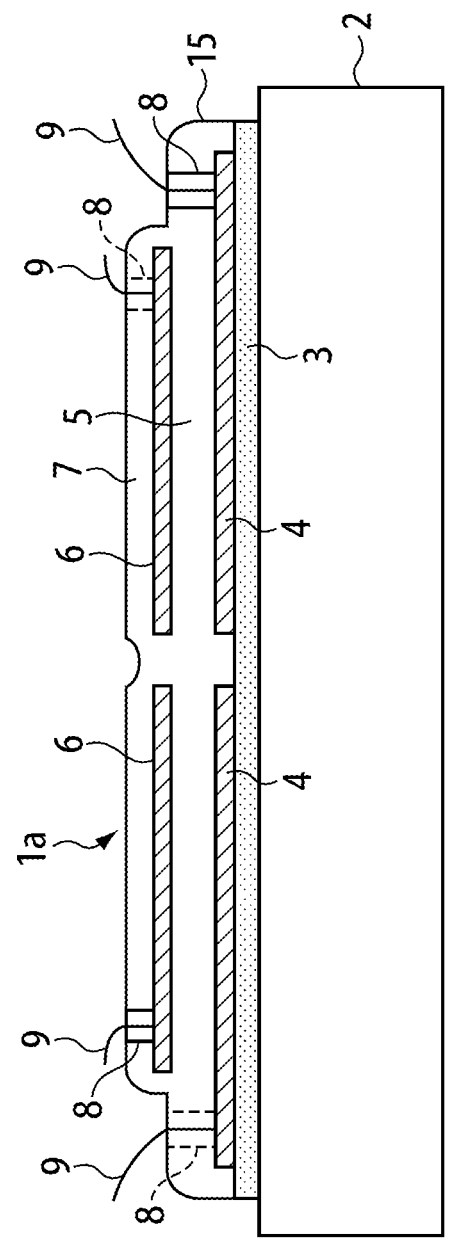
FIG.1A
FIG.1B

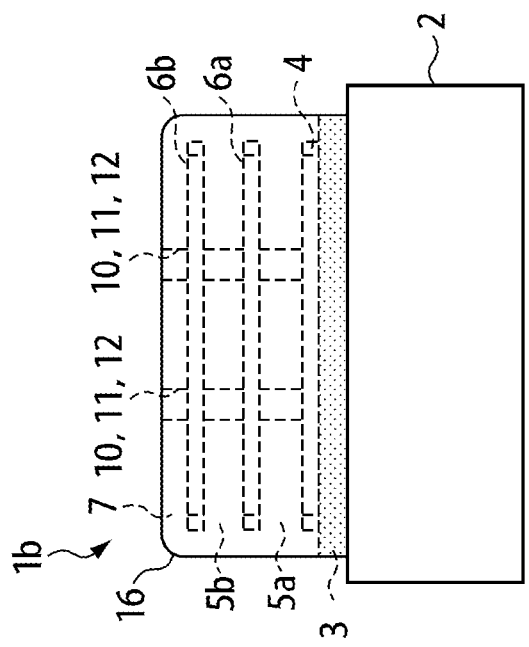
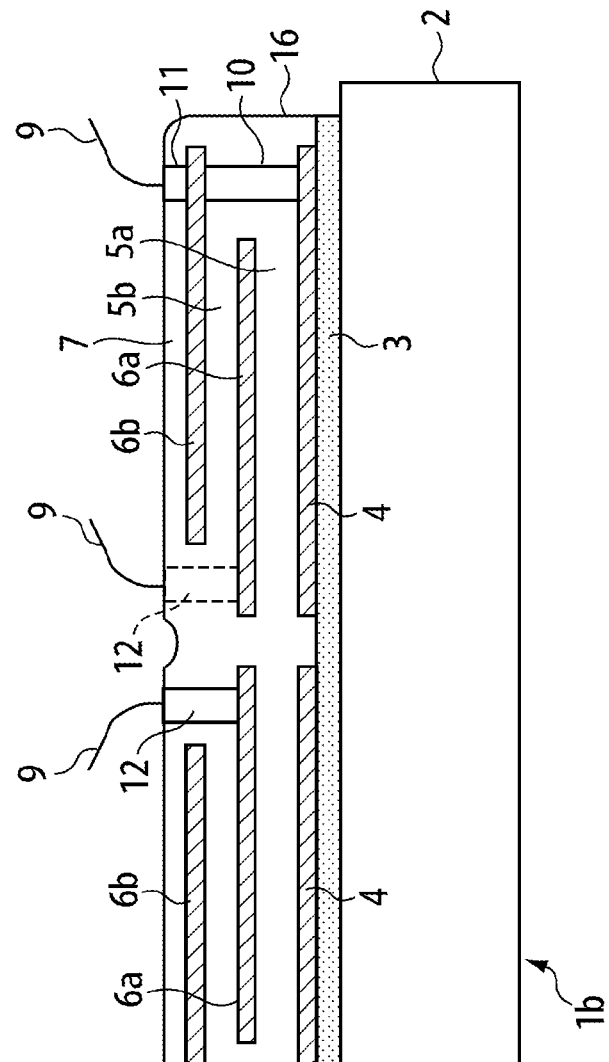

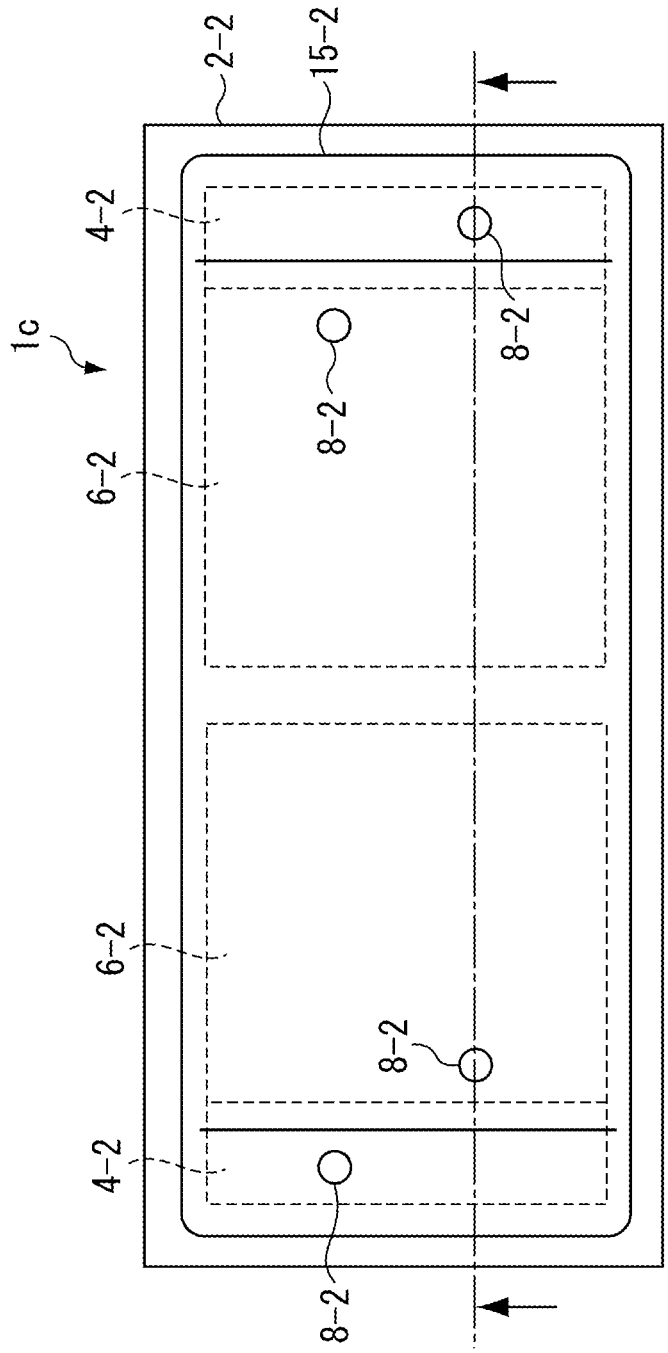

Prior Art

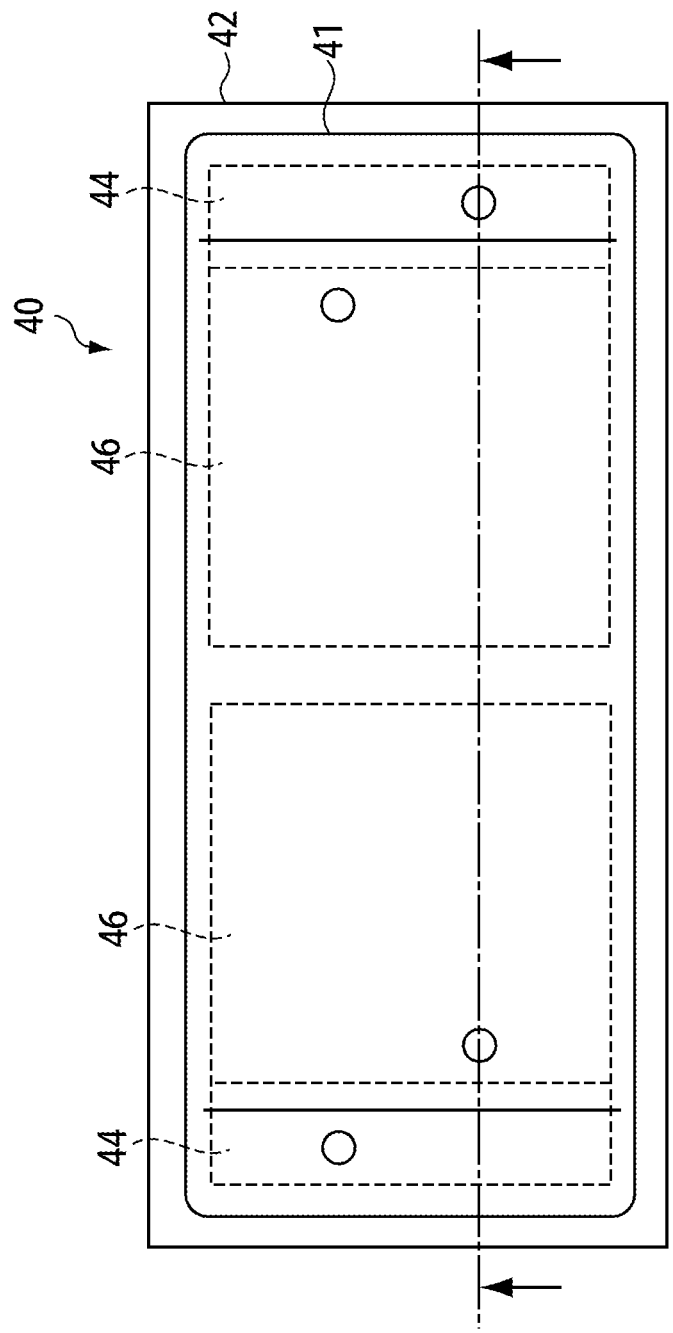

VIBRATION ELEMENT, MANUFACTURING METHOD THEREOF, AND VIBRATION WAVE ACTUATOR

BACKGROUND OF THE INVENTION

1. Field of the Invention

The present invention relates to a vibration element in which a piezoelectric element is fixed onto a substrate, a manufacturing method thereof, and a vibration wave actuator using the vibration element.

2. Description of the Related Art

In a vibration wave actuator, a piezoelectric element has commonly been used as a vibration source of a vibration element. A single plate piezoelectric element, or a laminated piezoelectric element obtained by stacking many piezoelectric layers and then sintering formed/integrated layers, is used as the piezoelectric element. Particularly, compared with the single plate piezoelectric element, the laminated piezoelectric element has an advantage of being able to obtain a large deformation or a large force with a low applied voltage due to multi-layering (U.S. Pat. No. 7,109,639).

FIG. 5 is a perspective view of appearance of a linear vibration wave (ultrasonic wave) actuator 30 discussed in U.S. Pat. No. 7,109,639. The linear vibration wave actuator 30 includes a vibration element 31 and a rod-shaped moving member (linear slider) 36 in pressure contact. The vibration element 31 includes a laminated piezoelectric element 35 and a drive plate 32 and the laminated piezoelectric element 35 has a plurality of piezoelectric layers and electrode layers stacked alternately. The drive plate 32 is made of metal and is bonded to the laminated piezoelectric element 35 by an adhesive. The drive plate 32 includes a plate portion formed in a rectangular shape and two protruding portions 33a and 33b formed in a convex shape on a top surface of the plate portion. The protruding portions 33a and 33b have contact portions 34a and 34b, respectively, formed on a tip surface thereof. The contact portions 34a and 34b are members to come directly into contact with the linear slider 36 as driven elements and thus have predetermined wear resistance. The linear vibration wave actuator 30 excites two bending vibration modes to cause the protruding portions 33a and 33b to make an elliptic motion. The elliptic motion generates a relative movement force between the linear slider 36 and the vibration element 31, with which the linear slider 36 is in contact under pressure. The linear slider 36 is linearly driven by the relative movement force.

When the laminated piezoelectric element 35 is manufactured, first a green sheet to be a piezoelectric layer is produced from piezoelectric material powder and an organic binder by the doctor blade or a similar method and then an electrode material paste is printed to predetermined positions on the green sheet to produce an electrode layer. Then, a predetermined number of green sheets are stacked in a plane shape and pressurized for lamination. Subsequently, the piezoelectric layer and the electrode layer are sintered at the same time to integrate the layers, and polarization is performed to finish the laminated piezoelectric element 35 to predetermined dimensions by machining in the end. Also a piezoelectric electrostrictive film actuator having an integrated laminated structure integrated by heat treatment of an electrode material and a piezoelectric material alternately stacked in a layered shape on at least one side of the ceramic substrate is known.

FIGS. 6A and 6B illustrate a vibration element 40 integrated by sintering a piezoelectric element 41, including a piezoelectric layer 45 and electrode layers 44 and 46, and a ceramic substrate 42, as a vibration element, at the same time. A piezoelectric layer 43 as a compound layer having the same components or the same main components as the piezoelectric layer 45 is placed between the electrode layer 44 of the piezoelectric element 41 and the ceramic substrate 42, and the piezoelectric element 41 and the ceramic substrate 42 are joined by sintering (Japanese Patent Application Laid-Open No. 2009-124791).

In the vibration element 31 of the linear vibration wave actuator 30 discussed in U.S. Pat. No. 7,109,639, the laminated piezoelectric element 35 and the drive plate 32 made of metal are bonded by an adhesive made of resin.

However, an adhesive made of resin is relatively soft. Thus, vibration damping of a vibration element is large and particularly an influence of the vibration damping of a vibration element increases with a decreasing size thereof, causing degradation of efficiency of a small vibration wave actuator as a leading factor. Moreover, when the vibration element is miniaturized, an influence of variations in thickness of an adhesion layer and accuracy of position due to adhesion on performance of a small vibration wave actuator increases and also variations of performance of small vibration wave actuators increase.

Further, according to the manufacturing method of a conventional laminated piezoelectric element, the costs of plant and equipment investment of production units for green sheet formation from piezoelectric material powder, laminating press, machining and the like are large, contributing to increasing manufacturing costs as a factor. Thus, like the above piezoelectric electrostrictive film actuator having an integrated laminated structure, a method of directly fixing a laminated piezoelectric element to a ceramic substrate without providing an adhesion layer with an adhesive at the same time as the production of the laminated piezoelectric element is used.

However, a chemical reaction is normally less likely to occur between an electrode layer of a piezoelectric element and a ceramic substrate, resulting in comparatively low bonding strength between the electrode layer and the substrate. Thus, the element may peel off from the substrate from the start or is more likely to peel off due to vibration.

Therefore, Japanese Patent Application Laid-Open No. 2009-124791 proposes the vibration element 40 integrated by sintering after the piezoelectric layer 43 being placed between the electrode layer 44 of the piezoelectric element 41 and the ceramic substrate 42.

However, while it is possible to increase bonding power with the ceramic substrate 42 by placing the piezoelectric layer 43 therebetween, the piezoelectric element 41 may peel off from the ceramic substrate 42 if a larger vibration amplitude is provided to a vibration element. Thus, it becomes necessary to further increase bonding power between the piezoelectric element 41 and the ceramic substrate 42.

SUMMARY OF THE INVENTION

The present invention is directed to a vibration element capable of outputting stable vibration energy by attempting to improve bonding strength between a piezoelectric element and a substrate with an inexpensive configuration and improving vibration efficiency by curbing vibration damping accompanying miniaturization, a manufacturing method thereof, and a vibration wave actuator.

According to an aspect of the present invention, a vibration element includes a substrate, a piezoelectric element including a piezoelectric layer and an electrode layer, and a bonding layer provided between the piezoelectric element and the substrate and comprising ceramic containing melted glass powder, wherein the vibration element causes the substrate to vibrate by vibration energy of the piezoelectric element to output the vibration energy of the substrate, and the piezoelectric element is fixed to the substrate via the bonding layer.

According to another aspect of the present invention, a method for manufacturing a vibration element by fixing a piezoelectric element having a piezoelectric layer and an electrode layer to a substrate includes forming a bonding layer containing glass powder on the substrate by using the substrate formed of ceramic or metal, forming the piezoelectric element on the formed bonding layer, and integrating the substrate, the bonding layer, and the piezoelectric element by simultaneous sintering thereof.

According to yet another aspect of the present invention, a vibration wave actuator includes the vibration element as a driving power source.

According to an exemplary embodiment of the present invention, a vibration element capable of outputting stable vibration energy by attempting to improve bonding strength between a piezoelectric element and a substrate with an inexpensive configuration and improving vibration efficiency by curbing vibration damping accompanying miniaturization, a manufacturing method thereof, and a vibration wave actuator can be realized.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 1A to 1C are block diagrams illustrating a configuration of a vibration element according to a first exemplary embodiment of the present invention. FIG. 1A is a front view, FIG. 1B is a side view, and FIG. 1C is a plan view.

FIGS. 2A to 2C are block diagrams illustrating the configuration of a vibration element according to a second exemplary embodiment of the present invention. FIG. 2A is a front view, FIG. 2B is a side view, and FIG. 2C is a plan view.

FIGS. 3A to 3C are block diagrams illustrating the configuration of a vibration element according to a third exemplary embodiment of the present invention. FIG. 3A is a front view, FIG. 3B is a side view, and FIG. 3C is a plan view.

FIGS. 6A and 6B are diagrams illustrating the configuration of a conventional vibration element.

DESCRIPTION OF THE EMBODIMENTS

Various exemplary embodiments, features, and aspects of the invention will be described in detail below with reference to the drawings.

Figure 1C:
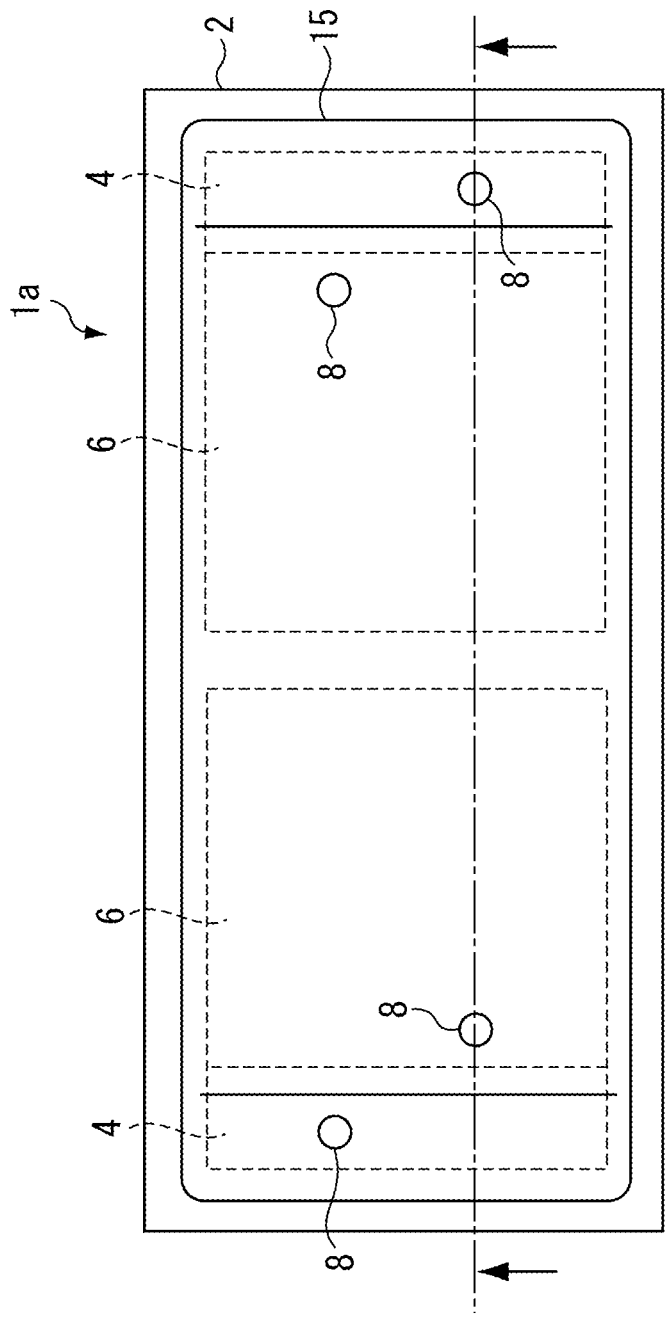

A configuration example of a vibration element according to a first exemplary embodiment of the present invention will be described with reference to FIGS. 1A to 1C. FIGS. 1A to 1C are a front view, a side view, and a plan view of the vibration element, respectively. FIG. 1B illustrates a section in a broken line position indicated by arrows in FIG. 1C.

A vibration element $1a$ illustrated in FIGS. 1A to 1C is assumed to be applied to a linearly driven vibration wave actuator. The vibration element $1a$ includes a substrate 2 in a plate shape, a piezoelectric element 15, and a bonding layer 3. As described below, the substrate 2 and the piezoelectric element 15 are bonded (fixed) and integrated by simultaneous sintering. That is, the piezoelectric element 15 functioning as a vibration energy source and the substrate 2 functioning as a vibration element that accumulates the vibration energy are fixed and integrated via the bonding layer 3. In the piezoelectric element 15, an electrode layer 4, a piezoelectric layer 5, an electrode layer 6, and a piezoelectric layer 7 are sequentially stacked. The electrode layer 4 is divided into two portions and the divided portions are arranged in a spaced state. Similarly, the electrode layer 6 is divided into two portions and the divided portions are arranged in a spaced state.

The piezoelectric layer 5 covers the entire surface of the electrode layer 4, and the piezoelectric layer 7 covers the entire surface of the electrode layer 6. Electric conduction between the electrode layers 4 and 6 and external portions (such as a control unit) is realized by forming a hole 8 in the piezoelectric layers 5 and 7 and introducing a conductive wire 9 onto the electrode layers 4 and 6 via the hole 8 to fix the conductor wire 9 to solder or the like. Alternatively, a through-hole filled with a conductor may be formed in the hole 8 to realize conduction to the conductor wire.

An alternating signal is supplied to the electrode layers 4 and 6 from the control unit that controls the vibration of the piezoelectric element 15, and the piezoelectric layer 5 expands and contracts (distortion) due to the alternating signal so that the expansion and contraction is output to the outside as vibration energy. The substrate 2 vibrates due to the vibration energy, and the vibration of the substrate 2 is used as a driving force to drive a driven element (see a linear slider 14 in FIG. 4).

The substrate 2 has a length of 12 mm, a width of 5 mm, and a thickness of 0.3 mm. The thickness of the bonding layer 3 is about 6 µm, the thickness of the piezoelectric layer 5 is about 12 µm, the thickness of the piezoelectric layer 7 is about 6 µm, and the thickness of the electrode layers 4, 6 is about 5 µm. The hole 8 for conduction has a diameter of 1 mm.

Next, the manufacturing method of the vibration element $1a$ will be described.

First, alumina (aluminum oxide) that is sintered ceramic in a plate shape is ground and cut to finish the substrate 2 to predetermined dimensions. Next, a piezoelectric material paste prepared by mixing piezoelectric material powder, glass powder, and an organic vehicle made up of an organic solvent and an organic binder and containing glass powder capable of forming a thick film is applied to the surface on one side of the ceramic plate by screen printing. Then, the organic solvent is removed by heating the applied piezoelectric material paste containing glass powder at about 150° C. for 10 min to dry the paste to form the bonding layer 3. Then, a conductive material paste is prepared by mixing conductive material powder containing silver and palladium as main components and an organic vehicle made up of an organic solvent and an organic binder. The conductive material paste is applied onto the dried bonding layer 3 by screen printing, and the paste is dried by heating at about 150° C. for 10 min to form the electrode layer 4.

Next, a piezoelectric material paste prepared by mixing piezoelectric material powder and an organic vehicle made up of an organic solvent and an organic binder and capable of forming a thick film is applied to the surface of the electrode layer 4 by screen printing. Then, the organic solvent is removed by heating the applied piezoelectric material paste at about 150° C. for 10 min to dry the paste to form the piezoelectric layer 5. By repeating the application and drying in this manner, the electrode layer 6 and the piezoelectric layer 7 are formed.

The piezoelectric material powder used to form the bonding layer 3 has lead zirconate and lead titanate ($PbZrO_3$—$PbTiO_3$) having a perovskite crystal structure as main components. Moreover, three-component or multi-component piezoelectric material powder prepared by adding and dissolving a small amount of a compound made of a plurality of metals is used. The same piezoelectric material powder is used for the piezoelectric layers 5 and 7.

Further, silicon oxide and boron oxide are contained as the glass powder and in addition, an additive such as bismuth oxide, alumina, alkali metal oxide, alkali earth metal oxide, and other metallic oxide is mixed and formulated so that a glass softening point appropriate for a burning temperature is achieved.

Then, glass powder (also called glass frit) prepared by pulverizing glass once melted into an average grain size of 1 to 2 μm is used. The glass powder is added by 0.2% to several percentage points by weight of the piezoelectric material powder to prepare a paste.

By changing the mixing ratio of silicon oxide and boron oxide, the softening point of glass can be changed. Also, the reaction with the substrate 2 can be increased by selecting the additive element.

The piezoelectric material powder of the bonding layer 3 is sintered during sintering and the glass powder softens and flows to gather in the respective interfaces of the substrate 2 and the electrode layer 4 so that the bonding layer 3 can strongly be bound to the substrate 2 and the electrode layer 4.

The piezoelectric layer 5 sandwiched between the electrode layers 4 and 6 is a layer that causes a displacement according to the applied voltage as a piezoelectric active portion with polarization treatment. The bonding layer 3 and the piezoelectric layer 7, on the other hand, are not piezoelectric active portions and instead, piezoelectric inactive portions that do not actually cause a displacement.

Incidentally, the piezoelectric layers 5 and 7 and the bonding layer 3 may be compounds in which the mixing ratio of main components of lead zirconate and lead titanate ($PbZrO_3$—$PbTiO_3$) is changed or components other than the main components are changed. In addition, the thickness of the piezoelectric layers 5 and 7 and the thickness of the bonding layer 3 may be made different.

A paste prepared by adding piezoelectric material powder by 10% by weight in advance in addition to a conductive material is used as the conductive material paste to form the electrode layers 4 and 6.

However, the same effect can be obtained if the piezoelectric material powder to be added contains the same components as those of the piezoelectric layer 5 or the same lead zirconate and lead titanate ($PbZrO_3$—$PbTiO_3$) as the main components. The piezoelectric layers 5 and 7 have a plate of screen printing worked with in advance so that the hole 8 (unprinted portion) can be formed and the electrode layers 4 and 6 are each divided into two portions via the unprinted portion to be arranged by being spaced.

The bonding layer 3, the piezoelectric layers 5 and 7, and the electrode layers 4 and 6 stacked alternately on the substrate 2 in this manner are in an unsintered state.

After the organic binder being removed first by heating using a furnace at temperature of 500° C. or below, the laminated layer is sintered in an atmosphere of lead at the highest temperature of 1100° C. in a retention time of two hours. That is, the bonding layer 3, the piezoelectric layers 5 and 7, the electrode layers 4 and 6, and the substrate 2 are sintered at the same time and integrated. In other words, the manufacture of a piezoelectric element and bonding (fixing) of the piezoelectric element and the substrate 2 occurred at the same time.

The bonding layer 3 made of ceramic is provided to bond the substrate 2 and the electrode layer 4. Silver and palladium forming the electrode layer 4 and used as conductive materials have weak bonding power with the substrate 2. Thus, if there is no bonding layer 3, the electrode layer 4 may be peeled off from the substrate 2 from the start, or the electrode layer 4 of the piezoelectric element 15 is more likely to be separated from the substrate 2 due to vibration.

The piezoelectric material powder of the bonding layer 3 whose main components are the same as those of the piezoelectric material is most desirable in terms of the thermal expansion coefficient, mechanical properties, and costs, but the powder material may have components similar to those of the substrate, in addition to those of the piezoelectric material.

In the present exemplary embodiment, for example, alumina powder mixed with glass powder may be used. Particularly, alumina is easily available and inexpensive, has high heat resistance, and is less likely to chemically react with other materials and thus, alumina powder having glass powder mixed therewith is appropriate.

If alumina is used for the substrate described below, above all, alumina is a material of the same kind and is more likely to bond through diffusion, making alumina suitable for bonding with the substrate.

Other material powder that can be sintered at the same time when the piezoelectric element is sintered during sintering can be used.

The electrode layer 4 uses conductive material powder made of noble metals containing silver as a main component and palladium by about 20% to 30% by weight of the whole powder. Thus, the electrode layer 4 starts to sinter at a lower temperature than the bonding layer 3 and the piezoelectric layer 5 and contraction caused by sintering is large so that a more compact layer is formed. Thus, melted glass is present only between the substrate 2 and the electrode layer 4, and there is almost no diffusion or penetration into the piezoelectric layer 5.

If glass diffuses or penetrates into the piezoelectric layer 5, piezoelectric characteristics of the piezoelectric layer 5 normally deteriorate and thus, the electrode layer 4 can prevent glass from diffusing or penetrating into the piezoelectric layer 5. Moreover, the force of peeling off from the bonding layer 3 or the piezoelectric layer 5 is made smaller by mixing piezoelectric powder in the electrode layer 4 to curb contraction caused by sintering of the conductive material powder.

As the material of the substrate 2, on the other hand, alumina, which is, as described above, sintered ceramic in a plate shape, is selected as a preferable material for the substrate as a vibration element. Compared with other ceramics, alumina is easily available and inexpensive. Moreover, vibration damping is relatively smaller when alumina is used as a vibration element.

However, mechanical strength deteriorates and vibration damping as a vibration element grows when purity thereof becomes lower and thus, alumina of higher purity is more desirable. Alumina is rather brittle as a mechanical component and so a small amount of other components may be added. For example, zirconia oxide can improve mechanical strength and electric insulation properties and so can be an additive. In this case, as discussed in Japanese Patent Application Laid-Open No. 2006-74850, zirconia oxide can be added by 5 to 40% by weight.

Any material that forms stable bonding with the bonding layer 3 having glass powder mixed therewith in advance may be used for the substrate 2. In addition to alumina, zirconia, silicon carbide, and silicon nitride, which are normal ceramics, but can easily bond to the substrate because glass powder is mixed in the bonding layer 3 in advance, can be used for the substrate. It is desirable to consider additive elements in addition to silicon oxide and boron oxide as glass powder components by fitting to various kinds of ceramics.

Further, the bonding layer 3 functions as a buffer of stress generated due to contraction when the substrate 2, the electrode layers 4 and 6, and the piezoelectric layers 5 and 7 are sintered or a difference of thermal expansion coefficients when the temperature drops after sintering so that an effect of preventing peeling of the substrate 2 and the electrode layer 4 is gained. When the vibration element vibrates, the bonding layer 3 functions also as a buffer for the substrate 2 of stress generated due to a displacement of the piezoelectric layer 5 acting as a piezoelectric active layer.

What is different from the conventional configuration is the use of the bonding layer 3 mixed with glass powder, whereby particularly glass molten solid material melted by sintering increases strength of close contact between the substrate 2 and the electrode layer 4 so that bonding power between the substrate 2 and the electrode layer 4 can be increased.

The piezoelectric layer 5 covers the electrode layer 4 and the piezoelectric layer 7 covers the electrode layer 6, and particularly the electrode layers 4 and 6 are completely covered up to edges thereof so that the electrode layers 4 and 6 are not exposed to the surface as protective layers of insulation properties. By providing the protective layers of the electrode layers 4 and 6 with the piezoelectric layers 5 and 7 in this manner, peeling of the electrode layers 4 and 6 caused by a mechanical force from outside can be prevented.

Moreover, peeling of the electrode layers 4 and 6 can be prevented by preventing, for example, a short circuit when foreign matter comes into contact, a current leak at high humidity, and infiltration of moisture into a gap between the electrode layers 4 and 6 and the piezoelectric layers 5 and 7.

After, as described above, the bonding layer 3, which is ceramic, the piezoelectric layers 5 and 7, the electrode layers 4 and 6, and the substrate 2 being sintered at the same time and integrated, the conductor wire 9 is bonded to the electrode layers 4 and 6 via the hole 8 of the piezoelectric layers 5 and 7 using solder or the like and a voltage is applied between the electrode layers 4 and 6 to perform polarization of the piezoelectric layer 5.

Polarization is performed under polarization conditions of applying a predetermined voltage of about 35 V (corresponding to 3 KV/mm) between the grounded (G) electrode layer 4 and the positive (+) electrode layer 6 in oil at temperature of 120 to 150° C. for about 30 min.

Pastes to form the bonding layer 3, the piezoelectric layers 5 and 7, and the electrode layers 4 and 6 are created by adding a small amount of additives and kneading an organic vehicle using an organic binder such as ethyl cellulose and an organic solvent such as terpineol using a three-roll mill.

While the thickness of a piezoelectric layer is set to 12 µm for screen printing in the present exemplary embodiment, piezoelectric layers and electrode layers whose thickness ranges from about 2 to 3 µm to 30 µm can be created with high precision. Divided electrodes and piezoelectric layers with a hole (unprinted portion) can be provided in a plate. Compared with lamination by the green sheets described above, the screen printing cannot only form a thinner and more precise film easily, but also control an application position with high precision without the need of machining after sintering.

Further, manufacturing equipment becomes more inexpensive. As a result of the above, the manufacturing cost also becomes more inexpensive.

Figure 2C:
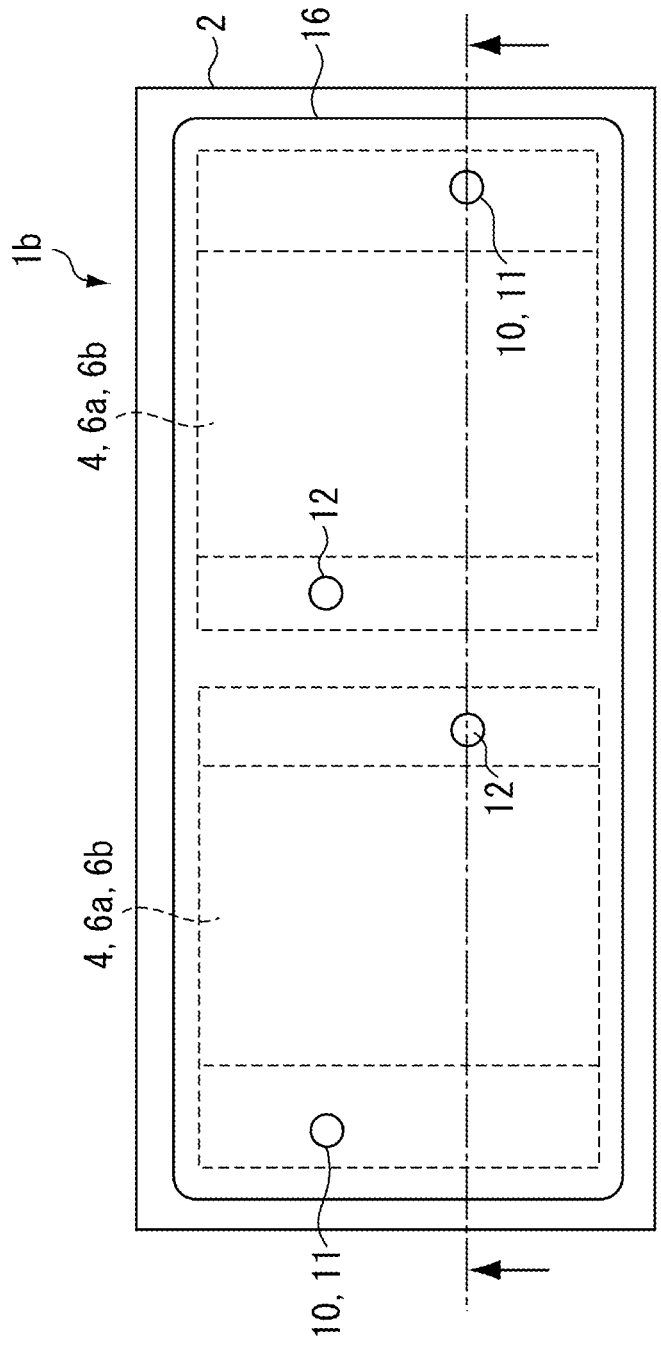

A configuration example of a vibration element according to a second exemplary embodiment of the present invention will be described with reference to FIGS. 2A to 2C. FIGS. 2A to 2C are a front view, a side view, and a plan view of the vibration element, respectively. FIG. 2B illustrates a section in a broken line position indicated by arrows in FIG. 2C.

While there is one piezoelectric layer sandwiched by electrode layers in the first exemplary embodiment, there are two piezoelectric layers sandwiched by electrode layers in the present exemplary embodiment. That is, compared with the first exemplary embodiment, a laminated piezoelectric element 16 in the present exemplary embodiment has one piezoelectric layer and one electrode layer added thereto. In other words, in the second exemplary embodiment, the voltage is made lower than in the first exemplary embodiment by increasing the layers to two piezoelectric layers acting as piezoelectric active portions.

The voltage can further be lowered by increasing the layers to three or more piezoelectric layers which are piezoelectric active portions.

In a vibration element 1b according to the present exemplary embodiment, the bonding layer 3, the electrode layer 4, a piezoelectric layer 5a, an electrode layer 6a, a piezoelectric layer 5b, an electrode layer 6b, and the piezoelectric layer 7 are sequentially stacked as the laminated piezoelectric element 16 on the sintered substrate 2 in a plate shape.

The piezoelectric layer 5a wholly covers the electrode layer 4, the piezoelectric layer 5b wholly covers the electrode layer 6a, and the piezoelectric layer 7 wholly covers the electrode layer 6b. The electrode layers 4 and 6b realize electric conduction through a hole 10 filled with a conductive paste (conductive material), and electric conduction to an external power supply can be established by the conductor wire 9 bonded to a hole 11. The electrode layer 6a can establish electric conduction to the outside (such as a control unit) via the conductor wire 9 bonded to a hole 12 filled with a conductive paste.

In the vibration element 1b, for example, the substrate 2 has the length of 12 mm, the width of 5 mm, and the thickness of 0.3 mm. The thickness of the ceramic layer 3 is about 6 µm, the thickness of the piezoelectric layers 5a and 5b is about 12 µm, the thickness of the piezoelectric layer 7 is about 6 µm, and the thickness of the electrode layers 4, 6a, and 6b is about 5 µm. The diameter of the holes 10 and 11 is 1 mm in consideration of wiring. In the present exemplary embodiment, the piezoelectric layers 5a and 5b become piezoelectric active portions.

In contrast to the first exemplary embodiment, the holes 10, 11, and 12 are filled with the conductive paste having almost the same components as the conductive paste forming the electrode layers 4, 6a, and 6b. In this case, after the holes 10, 11, and 12 being formed, the holes 10, 11, and 12 are filled with the conductive paste by the screen printing or the like before or after the electrode layers 4, 6a, and 6b are formed, and the substrate 2 is sintered simultaneously with the laminated piezoelectric element 16 for integration.

According to another manufacturing method, after the laminated piezoelectric element 16 being sintered, the holes 10, 11, and 12 may be filled with a conductive paste mixed with a heat-hardening adhesive and conductive powder.

Figure 4:
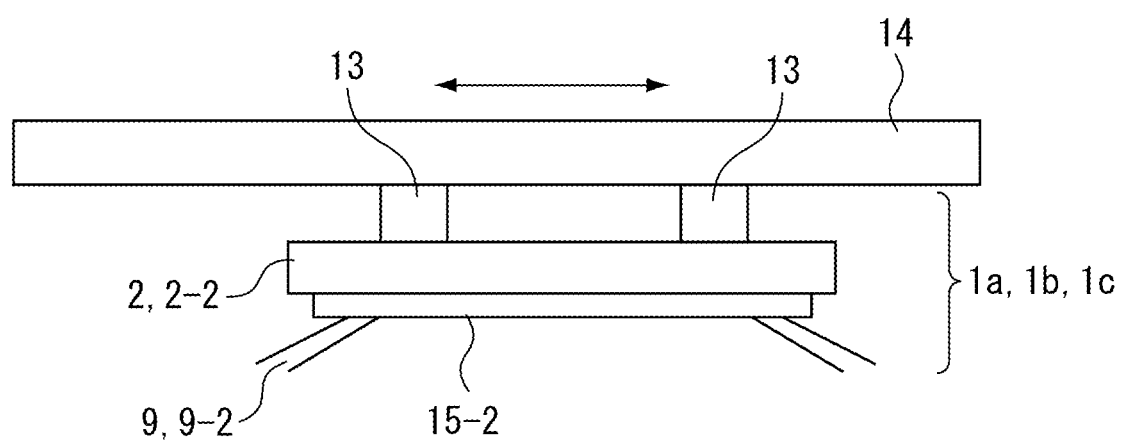
FIG. 4 is a diagram illustrating a drive mechanism of a linear vibration wave actuator into which the vibration element according to the first to third exemplary embodiments of the present invention is incorporated.
Figure 5:
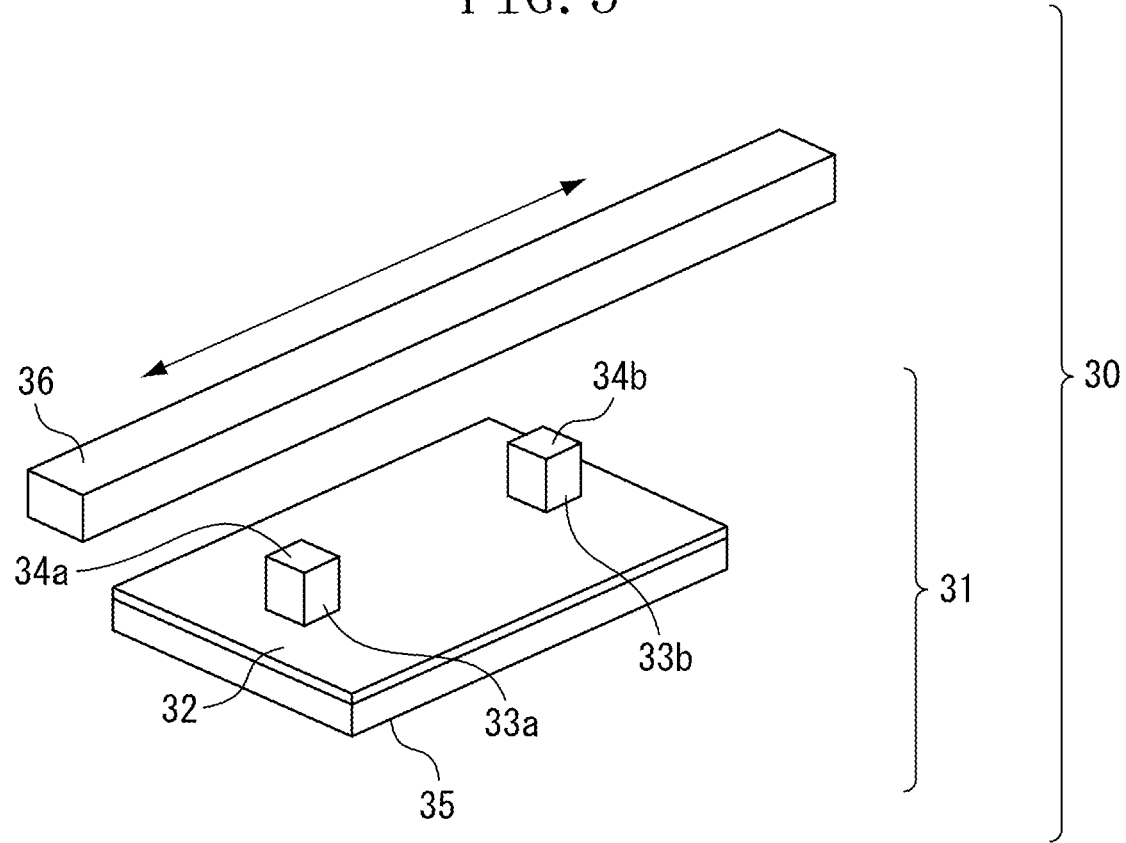
FIG. 5 is a diagram illustrating the configuration of a conventional linear vibration wave actuator.
Figure 6B:
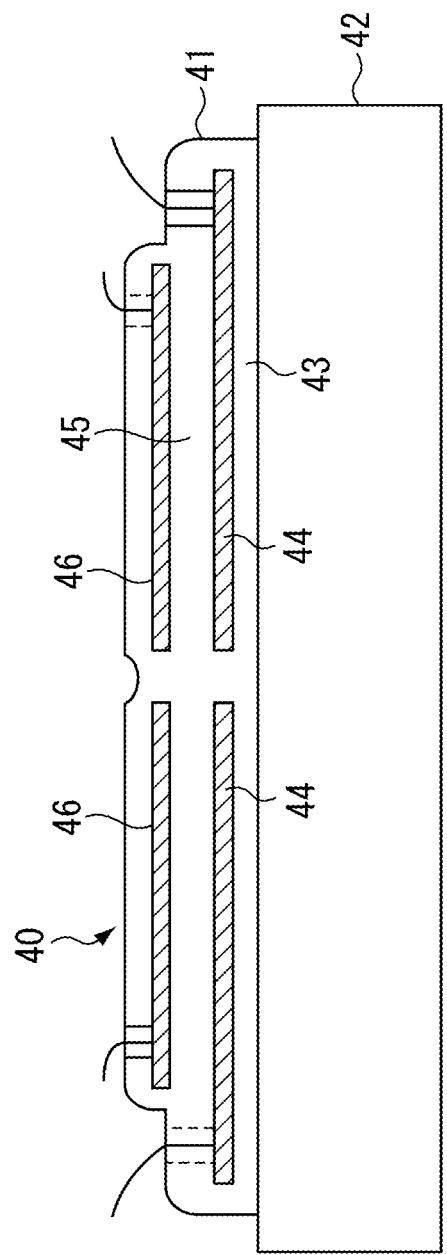

FIG. 4 is a diagram illustrating the configuration of a linear vibration wave actuator into which the vibration element 1a according to the first exemplary embodiment or the vibration element 1b according to the second exemplary embodiment is incorporated.

The principle of linear driving is the same as that in a conventional example. The vibration element 1a or the vibration element 1b is provided with a protruding portion 13.

The linear slider 14 under pressure comes into contact with the protruding portion 13 and the linear slider 14 moves due to an elliptic motion excited in the protruding portion 13 by the vibration of the piezoelectric element 15 or 16. That is, the linear vibration wave actuator makes a reciprocating motion of the linear slider 14 using the piezoelectric element 15 or 16 as a driving power source.

Incidentally, the present invention is not limited to the configurations of the first exemplary embodiment and the second exemplary embodiment and, for example, while a conductor wire is used for conduction between electrode layers and an external power supply, a flexible circuit board or a conductive paste may be used to establish electric conduction between electrode layers and the external power supply, instead of the conductor wire.

Figure 3A:
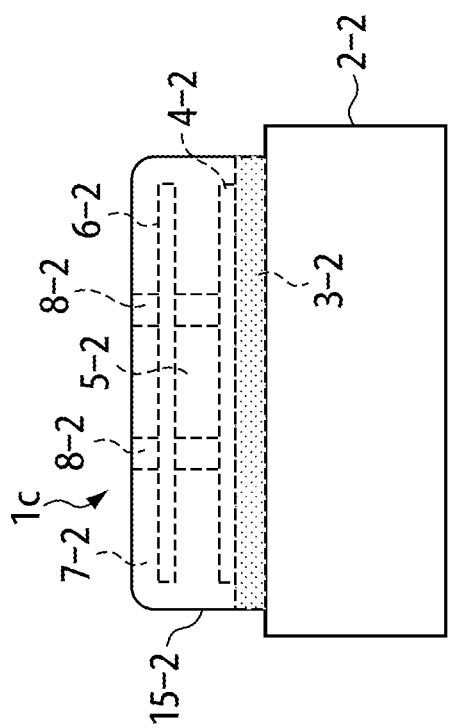
Figure 3B:
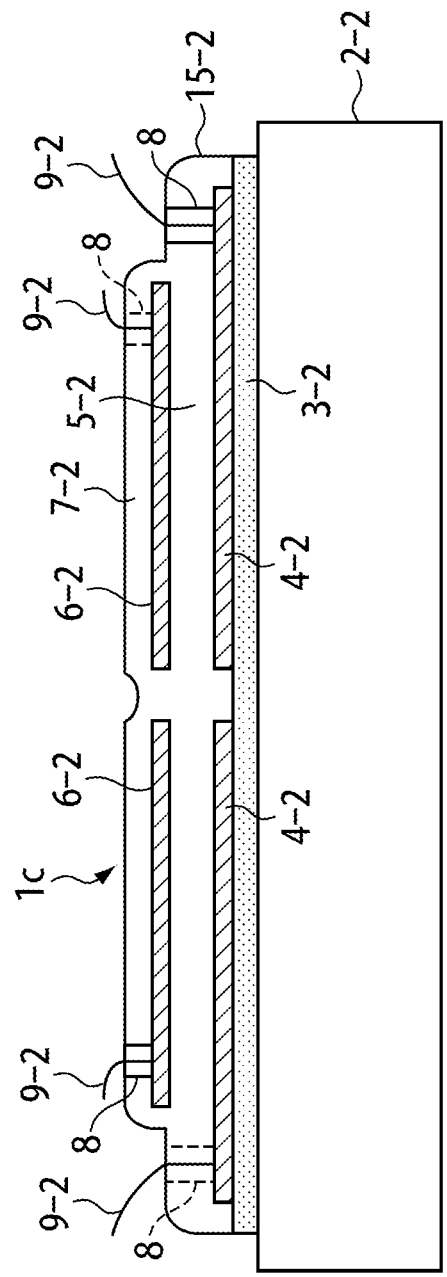

A configuration example of a vibration element according to a third exemplary embodiment of the present invention will be described with reference to FIGS. 3A to 3C. FIGS. 3A to 3C are a front view, a side view, and a plan view of the vibration element, respectively. FIG. 3B illustrates a section in a broken line position indicated by arrows in FIG. 3C.

A vibration element 1c illustrated in FIGS. 3A to 3C is assumed to be applied to a linearly driven vibration wave actuator.

The vibration element 1c includes a substrate 2-2 and a piezoelectric element 15-2 in a plate shape. Materials of the substrate and a piezoelectric element are different from those in the first exemplary embodiment. The substrate 2-2 and the piezoelectric element 15-2 are bonded (fixed) and integrated by, as described above, simultaneous sintering.

That is, the piezoelectric element 15-2 functioning as a vibration energy source and the substrate 2-2 functioning as a vibration element that accumulates the vibration energy are fixed and integrated via a bonding layer 3-2.

In the piezoelectric element 15-2, an electrode layer 4-2, a piezoelectric layer 5-2, an electrode layer 6-2, and a piezoelectric layer 7-2 are sequentially stacked.

The electrode layer 4-2 is divided into two portions, and the divided portions are arranged in a spaced state. Similarly, the electrode layer 6-2 is divided into two portions, and the divided portions are arranged in a spaced state. The piezoelectric layer 5-2 covers the entire surface of the electrode layer 4-2, and the piezoelectric layer 7-2 covers the entire surface of the electrode layer 6-2. Electric conduction between the electrode layers 4-2 and 6-2 and external portions (such as a control unit) is realized by forming a hole 8-2 in the piezoelectric layers 5-2 and 7-2 and introducing a conductive wire 9-2 onto the electrode layers 4-2 and 6-2 via the hole 8-2 to fix the conductor wire 9-2 with solder or the like. An alternating signal is supplied to the electrode layers 4-2 and 6-2 from the control unit that controls the vibration of the piezoelectric element 15-2, and the piezoelectric layer 5-2 expands and contracts (distortion) due to the alternating signal so that the expansion and contraction is discharged to the outside as mechanical vibration energy. The substrate 2-2 vibrates due to the vibration energy, and the vibration of the substrate 2-2 is used as a driving force to drive a driven element (see the linear slider 14 in FIG. 4).

The substrate 2-2 has the length of 12 mm, the width of 5 mm, and the thickness of 0.3 mm. The thickness of the bonding layer 3-2 is about 6 μm, the thickness of the piezoelectric layer 5-2 is about 12 μm, the thickness of the piezoelectric layer 7-2 is about 6 μm, and the thickness of the electrode layers 4-2 and 6-2 is about 5 μm. The hole 8-2 for conduction has a diameter of 1 mm.

Next, the manufacturing method of the vibration element 1c will be described.

First, martensitic stainless steel (SUS420J2), which is excellent in vibration characteristics and easy to machine, is ground and cut to finish the substrate 2-2 to predetermined dimensions. Next, a piezoelectric material paste prepared by mixing piezoelectric material powder, glass powder, and an organic vehicle made up of an organic solvent and an organic binder and containing glass powder capable of forming a thick film is applied to the surface on one side of the substrate 2-2 by screen printing. Then, the organic solvent is removed by heating the applied piezoelectric material paste containing glass powder at about 150° C. for 10 min to dry the paste to form the bonding layer 3-2.

Piezoelectric material powder prepared by adding a small amount of compound made of one or a plurality of metallic elements to barium titanate ($BaTiO_3$) as the main component is used as the piezoelectric material powder of the bonding layer 3-2.

Silicon oxide and boron oxide are contained as the glass powder and in addition, bismuth oxide, alumina, alkali metal oxide, and alkali earth metal oxide are mixed. Then, glass powder (also called glass frit) prepared by pulverizing glass once melted into an average grain size of 1 to 2 μm is used. The glass powder is added by 0.2% to several percentage points by weight of the piezoelectric material powder to prepare a paste.

By changing the mixing ratio of silicon oxide and boron oxide, the softening point of glass can be changed. Also by selecting the additive element, reactions with the substrate can be increased. Then, a conductive material paste is prepared by mixing conductive material powder made of silver and an organic vehicle made up of an organic solvent and an organic binder.

The conductive material paste is applied onto the dried bonding layer 3-2 by screen printing and the paste is dried by heating at about 150° C. for 10 min to form the electrode layer 4-2. Silver in the conductive material powder may contain a slight amount of platinum or palladium.

Next, a piezoelectric material paste prepared by mixing piezoelectric material powder, glass powder as a sintering assistant, and an organic vehicle made up of an organic solvent and an organic binder and capable of forming a thick film is applied to the surface on one side of the substrate by screen printing. Then, the organic solvent is removed by heating the applied piezoelectric material paste at about 150° C. for 10 min to dry the paste to form the piezoelectric layer 5-2.

A piezoelectric material prepared by adding a small amount of compound made of one or a plurality of metallic elements to barium titanate ($BaTiO_3$) as the main component is used for the piezoelectric layer 5-2. The sintering temperature of barium titanate ($BaTiO_3$) is normally high and thus, glass powder as a sintering assistant is mixed in the present exemplary embodiment so that the piezoelectric layers 5-2 and 7-2 can be sintered at 700° C. The glass powder as a sintering assistant is silicon oxide or boron oxide that is basically the same as the glass powder mixed in the bonding layer 3-2, but it is desirable to prevent deterioration of piezoelectric characteristics when possible by appropriately selecting the mixing ratio or additive elements thereof.

By repeating the application and drying in this manner, the electrode layer 6-2 and the piezoelectric layer 7-2 are formed.

If glass powder is mixed with piezoelectric material powder, original piezoelectric characteristics generally deteriorate due to involvement of a glass phase having no ferroelectricity (piezoelectricity), but a certain level of piezoelectric characteristics is present and thus, glass powder can be used under conditions where inclusion of lead is not desirable.

The piezoelectric layer 5-2 is a layer that causes a displacement as a piezoelectric active portion on which polarization is performed and its chemical composition directly affects performance of a vibration wave actuator. On the other hand, the bonding layer 3-2 and the piezoelectric layer 7-2 are not piezoelectric active portions and instead, piezoelectric inactive portions.

As will described below, at least the piezoelectric element 15-2 is formed of the piezoelectric layer 7-2 as an inactive portion on the side opposite to the side fixed to the substrate 2-2.

Components other than the main component of barium titanate ($BaTiO_3$) of the piezoelectric layer 5-2, and the bonding layer 3-2, and the piezoelectric layer 7-2 can be changed to fit each purpose. Moreover, the thickness of the piezoelectric layer 5-2 and the thickness of the bonding layer 3-2 and the piezoelectric layer 7-2 may be made different.

A conductive material paste prepared by adding barium titanate powder by 10% by weight in addition to a conductive material is used to form the electrode layers 4-2 and 6-2. A similar effect is obtained if piezoelectric material powder to be added has the same component as that of the piezoelectric layer 5-2 or the main component thereof is the same barium titanate.

The piezoelectric layers 5-2 and 7-2 have a plate of screen printing worked with in advance so that the hole 8-2 (unprinted portion) can be formed and the electrode layers 4-2 and 6-2 are each divided into two portions via the unprinted portion to be arranged in a spaced state. A plurality of the bonding layer 3-2, the piezoelectric layers 5-2 and 7-2, and the electrode layers 4-2 and 6-2 stacked alternately on the substrate 2-2 in this manner is in an unsintered state.

After the organic binder being removed by heating using a furnace at temperature of 500° C. or below, the laminated layer is sintered in the atmosphere at temperature 700° C. That is, the bonding layer 3-2, the piezoelectric layers 5-2 and 7-2, the electrode layers 4-2 and 6-2, and the substrate 2-2 are sintered at the same time and integrated. In other words, the manufacture of a piezoelectric element and bonding (fixing) of the piezoelectric element and a substrate occurred at the same time.

The bonding layer 3-2 is provided to bond the substrate 2-2 and the electrode layer 4-2.

Silver forming the electrode layer 4-2 and used as a conductive material has weak bonding power with the substrate 2-2. Thus, if there is no bonding layer 3-2, the electrode layer 4-2 may be peeled off from the substrate 2-2 from the start due to contraction caused by powder sintering when conductive material powder is sintered and thermal expansion after the sintering is more likely to peel off due to vibration of the piezoelectric element 15-2.

Material powder whose main component is the same as that of the piezoelectric material is desirable for the bonding later 3-2 in terms of the thermal expansion coefficient and mechanical properties, but in addition to the piezoelectric material, the material powder may be alumina powder in which glass powder is mixed. Above all, alumina is appropriate because alumina has a thermal expansion coefficient similar to the thermal expansion coefficients of stainless steel and barium titanate described above and is less likely to react with other materials.

Other ceramic powder that can be sintered at the same time when piezoelectric elements are sintered during sintering can be used.

By mixing piezoelectric powder in the electrode layer 4-2 in advance, contraction caused by sintering of the conductive material powder is curbed to weaken a peeling force.

Further, glass powder is mixed in the bonding layer 3-2 in advance and the glass powder melts and gathers in the respective interface of the substrate 2-2 and the electrode layer 4-2 during sintering so that the bonding layer 3-2 can strongly be bound to the substrate 2-2 and the electrode layer 4-2 after sintering.

As the metal of the substrate 2-2, on the other hand, in addition to the above stainless steel, other chrome or chromium-nickel stainless steel may be selected as a further preferable material of the substrate (vibration element). This is because such metals of all metals are easily available and inexpensive, has high heat resistance, and vibration damping as a vibration element is small.

Compared with ceramic, stainless steel has oxide formed on the surface thereof and so stable bonding is likely to be formed with the bonding layer 3-2 in which glass powder is mixed in advance so that bonding occurs easily.

Further, thermal expansion coefficients of barium titanate, alumina, and stainless steel are close and can be used.

The bonding layer 3-2 functions also as a buffer of stress generated during vibration so that peeling of the substrate 2-2 and the electrode layer 4-2 can be prevented.

Like in the first exemplary embodiment, the piezoelectric layer 5-2 covers the electrode layer 4-2, the piezoelectric layer 7-2 covers the electrode layer 6-2, and particularly the electrode layers 4-2 and 6-2 are completely covered up to edges thereof, so that the electrode layers 4-2 and 6-2 are not exposed to the surface as protective layers of insulation properties.

By providing the protective layers of the electrode layers 4-2 and 6-2 with the piezoelectric layers 5-2 and 7-2 in this manner, peeling of the electrode layers 4-2 and 6-2 caused by a mechanical force from outside can be prevented.

Moreover, peeling of the electrode layers 4-2 and 6-2 can be prevented by preventing, for example, a short circuit when foreign matter comes into contact, a current leak at high humidity, and infiltration of moisture into a gap between the electrode layers 4-2 and 6-2 and the piezoelectric layers 5-2 and 7-2.

As described above, the bonding layer 3-2, the piezoelectric layers 5-2 and 7-2, the electrode layers 4-2 and 6-2, and the substrate 2-2 are sintered at the same time and integrated. Then, the conductor wire 9-2 is bonded to the electrode layers 4-2 and 6-2 via the hole 8-2 of the piezoelectric layers 5-2 and 7-2 using solder or the like, and a voltage is applied between the electrode layers 4-2 and 6-2 to perform polarization of the piezoelectric layer 5-2.

Polarization is performed under polarization conditions of applying a predetermined voltage of about 35 V (corresponding to 3 KV/mm) between the grounded (G) electrode layer 4-2 and the positive (+) electrode layer 6-2 in oil at temperature 80° C. for about 30 min.

FIG. 4 is a diagram illustrating the configuration of a linear vibration wave actuator into which the vibration element 1c according to the present exemplary embodiment is incorporated.

According to the exemplary embodiments of the present invention, as described above, glass powder is used for bonding so that the present invention can be applied to a variety of substrates and a variety of piezoelectric materials, enabling an occurrence of stable bonding power. Moreover, the manufacturing cost becomes more inexpensive.

Such configurations of the exemplary embodiments of the present invention are useful for development of vibration actuators in the future.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-124711 filed May 31, 2010, which is hereby incorporated by reference herein in its entirety.

What is claimed is:

1. A method for manufacturing a vibration element, the method comprising:
    forming a layer comprising ceramic containing glass on a substrate comprising ceramic or metal;
    forming a conductive layer on the layer
    forming a layer to be a piezoelectric layer on the conductive layer; and
    sintering the substrate, the layer comprising ceramic, the conductive layer, and the layer to be the piezoelectric layer together,
    wherein the layer comprises ceramic a compound whose main component is the same as a main component of the piezoelectric layer.

2. The method for manufacturing the vibration element according to claim 1, wherein a piezoelectric element comprises the conductive layer and the layer to be the piezoelectric layer.

3. The method for manufacturing the vibration element according to claim 1, wherein the component or the main component is a piezoelectric material.

4. The method for manufacturing the vibration element according to claim 1, wherein forming the layer comprising ceramic comprises applying a piezoelectric material paste on the substrate.

5. The method for manufacturing the vibration element according to claim 4, wherein forming the layer comprising ceramic further comprising heating the applied piezoelectric material.

6. The method for manufacturing the vibration element according to claim 4, wherein the piezoelectric material paste is applied by screen printing.

7. The method for manufacturing the vibration element according to claim 1, wherein the glass comprises silicon oxide, boron oxide, and an additive.

8. The method for manufacturing the vibration element according to claim 1, wherein the substrate comprises ceramic or metal.

9. The method for manufacturing the vibration element according to claim 1, wherein the substrate comprises alumina or ceramic prepared by adding zirconia to alumina as a main component.

10. The method for manufacturing the vibration element according to claim 1, wherein the metal in the substrate is stainless steel.

11. The method for manufacturing the vibration element according to claim 1, wherein material for the conductive layer is different from material for the substrate.

12. The method for manufacturing the vibration element according to claim 1, wherein material for the layer comprising ceramic is different from any one of material for the conductive layer and material for the substrate.

* * * * *